(12) United States Patent
Chang

(10) Patent No.: US 11,563,166 B2
(45) Date of Patent: Jan. 24, 2023

(54) PIEZOELECTRIC POLING OF A WAFER WITH TEMPORARY AND PERMANENT ELECTRODES

(71) Applicant: INVENSENSE, INC., San Jose, CA (US)

(72) Inventor: Chienliu Chang, Los Altos, CA (US)

(73) Assignee: INVENSENSE, INC., San Jose, CA (US)

(*) Notice: Subject to any disclaimer, the term of this patent is extended or adjusted under 35 U.S.C. 154(b) by 379 days.

(21) Appl. No.: 16/812,752

(22) Filed: Mar. 9, 2020

(65) Prior Publication Data

US 2020/0287126 A1   Sep. 10, 2020

Related U.S. Application Data

(60) Provisional application No. 62/814,991, filed on Mar. 7, 2019.

(51) Int. Cl.
| | |
|---|---|
| *H01L 41/257* | (2013.01) |
| *B06B 1/02* | (2006.01) |
| *B06B 1/06* | (2006.01) |
| *H01L 41/04* | (2006.01) |
| *H01L 41/047* | (2006.01) |

(Continued)

(52) U.S. Cl.
CPC .......... *H01L 41/257* (2013.01); *B06B 1/0207* (2013.01); *B06B 1/0688* (2013.01); *G06V 40/1306* (2022.01); *H01L 41/042* (2013.01); *H01L 41/0475* (2013.01); *H01L 41/0825* (2013.01); *H01L 41/193* (2013.01);

(Continued)

(58) Field of Classification Search
CPC . H01L 41/257; H01L 41/042; H01L 41/0475; H01L 41/0825; H01L 41/193; H01L 41/29; H01L 41/332; B06B 1/0207; B06B 1/0688; B06B 2201/40; B06B 2201/70; B06B 1/0692; B06B 1/0629; G06V 40/1306
See application file for complete search history.

(56) References Cited

U.S. PATENT DOCUMENTS

| | | | |
|---|---|---|---|
| 8,810,971 B1 * | 8/2014 | Vitikkate | H01L 41/096 360/294.4 |
| 8,937,790 B2 | 1/2015 | Kautzky | |

(Continued)

FOREIGN PATENT DOCUMENTS

| | | | | |
|---|---|---|---|---|
| GB | 2551803 A | * | 1/2018 | B41J 2/161 |
| TW | 201739523 A | * | 11/2017 | B06B 1/0238 |

*Primary Examiner* — Ermias T Woldegeorgis
(74) *Attorney, Agent, or Firm* — Haley Guiliano LLP; Joshua Van Hoven; Stefan D. Osterbur

(57) ABSTRACT

An array of piezoelectric micromachined ultrasound transducers (PMUTs) has a layer of piezoelectric material that requires poling during fabrication in order to properly align the piezoelectric dipoles to create a desired ultrasonic signal. The PMUT may have an interconnected set of lower electrodes that are fabricated between a processing layer of the PMUT and the piezoelectric layer. An upper electrode is fabricated overlaying the piezoelectric layer, and a poling voltage is applied between the upper electrode and the interconnected set of lower electrodes. After poling is complete, portions of the interconnected set of lower electrodes are removed to permanently isolate permanent lower electrodes from each other.

21 Claims, 12 Drawing Sheets

(51) Int. Cl.
*H01L 41/193* (2006.01)
*H01L 41/29* (2013.01)
*H01L 41/332* (2013.01)
*H01L 41/08* (2006.01)
*G06V 40/13* (2022.01)

(52) U.S. Cl.
CPC ............ *H01L 41/29* (2013.01); *H01L 41/332* (2013.01); *B06B 2201/40* (2013.01); *B06B 2201/70* (2013.01)

(56) References Cited

U.S. PATENT DOCUMENTS

| | | |
|---|---|---|
| 10,236,022 B2 | 3/2019 | Ee |
| 10,341,782 B2 | 7/2019 | Kitchens |
| 2009/0307885 A1* | 12/2009 | Nihei .................. H01L 41/257 29/25.35 |
| 2013/0278111 A1* | 10/2013 | Sammoura ............ H01L 41/047 310/317 |
| 2014/0355387 A1 | 12/2014 | Kitchens |
| 2018/0198055 A1 | 7/2018 | Zhong |
| 2019/0095045 A1 | 3/2019 | Khajeh |

* cited by examiner

PIEZOELECTRIC POLING OF A WAFER WITH TEMPORARY AND PERMANENT ELECTRODES

CROSS-REFERENCE TO RELATED APPLICATIONS

This application claims priority benefit under 35 U. S. C. § 119(e) from U.S. provisional application No. 62/814,991, entitled "Devices and Fabrication Methods for Poling PVDF on a CMOS Wafer Without Damaging CMOS," filed on Mar. 7, 2019. The aforementioned, earlier-filed application is hereby incorporated by reference herein in its entirety.

BACKGROUND

An ultrasound device such as a piezoelectric micromachined ultrasound transducer (PMUT) device may be utilized in a variety of applications. The ultrasound device may include a piezoelectric material that provides an electromechanical response based on a given input signal. For example, when an electrical signal is applied to the piezoelectric material, the material may exhibit a mechanical response. In response to a received mechanical signal, the piezoelectric material may exhibit an electrical response.

By designing an ultrasound device (e.g., a PMUT device or multiple PMUT devices) in a particular manner, desired signals may be produced and/or sensed. An exemplary sensor that utilizes ultrasound PMUT technology may be an ultrasound PMUT fingerprint sensor. Portions of an array of PMUT transducers may be selectively activated by electrical signals to output corresponding ultrasonic signals that are transmitted in the direction of a finger. Portions of the array of PMUT devices may sense the reflections of the transmitted ultrasonic signal based on the electrical output due to the mechanical forces exerted by the reflected signals. A suitable number of PMUT devices and arrays may be implemented in order to measure the contours of the user's fingerprint based on the reflected signals.

PMUT devices may be manufactured as PMUT arrays using semiconductor manufacturing processes. In ultrasound transducers, these PMUT arrays may form an ultrasonic transducer array. Different layers of material may be deposited, etched, and processed in a sequential set of operations to build the PMUT array and individual PMUT devices. Some piezoelectric materials may require a poling signal to be applied to orient the piezoelectric dipoles of the piezoelectric material, for example, in the direction where the finger will be applied to a fingerprint sensor. Poling of some piezoelectric materials may require high voltages to be applied to the piezoelectric material. If lower voltages are applied to the piezoelectric material, these voltages may be applied over an extended time period, and still may be at least partially ineffective for poling.

SUMMARY

In some embodiments of the present disclosure, a method for poling a piezoelectric layer of a wafer having a plurality of ultrasonic transducers comprises accessing a first terminal of the wafer, wherein the first terminal is electrically connected to a plurality of permanent lower electrodes of the wafer by a plurality of temporary electrodes of the wafer, wherein the plurality of permanent lower electrodes and the plurality of temporary electrodes overlay a substrate layer of the wafer, and wherein the plurality of permanent lower electrodes and the plurality of temporary electrodes are located below the piezoelectric layer. The method may further comprise accessing an upper electrode of the wafer, wherein the upper electrode is located above the piezoelectric layer, and applying a poling voltage between the first terminal and the upper electrode, wherein the poling voltage comprises a voltage suitable to modify piezoelectric dipoles of the piezoelectric layer. The method may further comprise disconnecting the poling voltage from the first terminal and the second terminal; and removing at least a portion of the temporary electrodes, wherein the plurality of permanent lower electrodes are not electrically connected to each other when the portions of the temporary electrodes are removed, and wherein each permanent lower electrode of the plurality of permanent lower electrodes corresponds to a respective one of the plurality of ultrasonic transducers.

In some embodiments of the present disclosure, a piezoelectric ultrasound sensor comprises a substrate layer and a plurality of permanent lower electrodes overlaying the substrate layer, wherein the plurality of permanent lower electrodes are electrically isolated from each other and are individually electrically connected to the substrate layer. The piezoelectric ultrasound sensor may further comprise a plurality of temporary electrodes at least partially overlaying the substrate layer, wherein each of the temporary electrodes is electrically connected to at least one of the permanent lower electrodes, and wherein each of the temporary electrodes is associated with at least one respective first removed region of temporary electrode material located between adjacent temporary electrodes. The piezoelectric ultrasound sensor may further comprise a piezoelectric layer overlaying the permanent lower electrodes and the temporary electrodes, wherein the piezoelectric layer includes a plurality of through holes, and wherein each of the through holes is associated with at least one of the removed regions. The piezoelectric ultrasound sensor may further comprise an upper electrode overlaying the piezoelectric layer, wherein the upper electrode includes a plurality of second removed regions associated with the plurality of through holes. The piezoelectric ultrasound sensor may further comprise processing circuitry electrically connected to the upper electrode and the plurality of temporary electrodes, wherein, to selectively activate ultrasonic transducers of the piezoelectric ultrasound sensor, processing circuitry is configured to apply a potential to the upper electrode and to selectively apply a piezoelectric activation signal to one or more of the permanent lower electrodes.

In some embodiments of the present disclosure, a system for poling a piezoelectric layer having a plurality of ultrasound transducers comprises a substrate layer comprising a first terminal and a plurality of permanent lower electrodes overlaying the substrate layer, wherein each permanent lower electrode of the plurality of permanent lower electrodes corresponds to a respective one of the plurality of ultrasonic transducers. The system may further comprise a plurality of temporary electrodes overlaying the substrate layer, wherein the first terminal is electrically connected to the plurality of permanent lower electrodes by the plurality of temporary electrodes, wherein a first material of the plurality of temporary electrodes is a different material than a second material of the plurality of permanent lower electrodes, and wherein the first material is removable by a first etching process and the second material is not removable by the first etching process. The system may further comprise a piezoelectric layer overlaying the plurality of permanent lower electrodes and the plurality of temporary electrodes, an upper electrode overlaying the piezoelectric layer, and a voltage source coupled to the first terminal and the upper electrode, wherein the voltage source is configured to apply a poling voltage between the first terminal and the upper electrode, and wherein the poling voltage comprises a voltage suitable to modify piezoelectric dipoles of the piezoelectric layer.

BRIEF DESCRIPTION OF THE DRAWINGS

The above and other features of the present disclosure, its nature and various advantages will be more apparent upon consideration of the following detailed description, taken in conjunction with the accompanying drawings, in which.

DETAILED DESCRIPTION OF THE DRAWINGS

Figure 1:
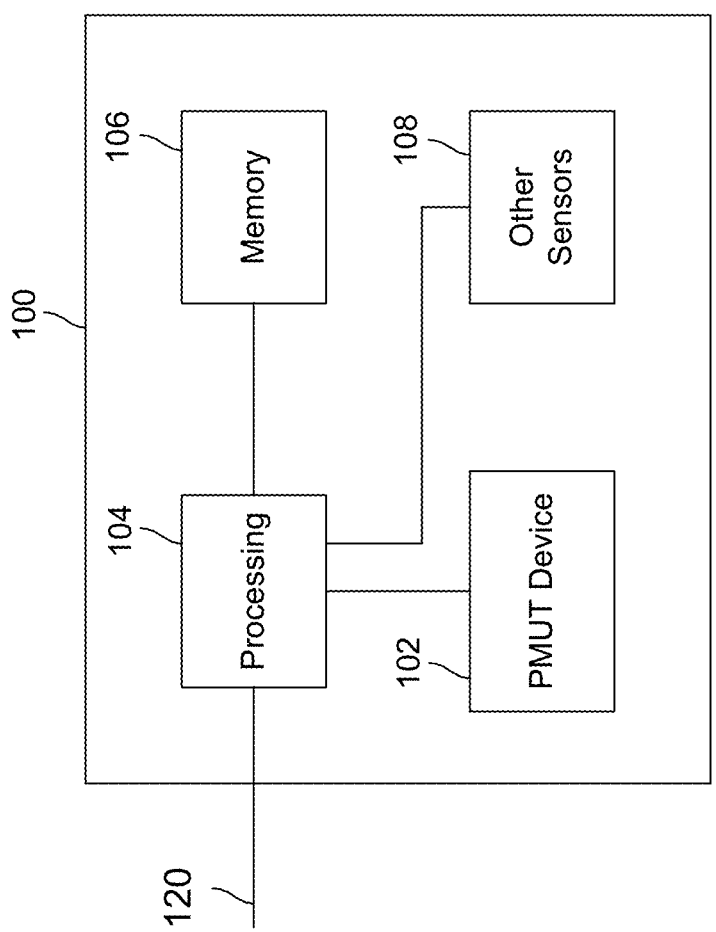
FIG. 1 depicts an exemplary fingerprint sensing system in accordance with some embodiments of the present disclosure.

Microelectromechanical systems (MEMS) may refer to a class of structure or devices fabricated using semiconductor-like processes and exhibiting mechanical characteristics such as the ability to move or deform. MEMS often, but not always, interact with electrical signals. Fingerprint sensing through MEMS devices may be achieved through an array of piezoelectric micromachined ultrasound transducer (PMUT) devices. The general principle of these devices is that they transmit ultrasonic waves which may interact with object position on or close to the device, such as a fingerprint sensor interacting with the end of a finger. By detecting and analyzing the reflected waves, characteristics of the object can be determined. In the case of an ultrasonic fingerprint sensor, the sensor may be used to acquire a fingerprint image of a finger pressed on the sensor. PMUT devices may have additional applications in any suitable application wherein ultrasonic signals may be used to identify physical characteristics of interest (e.g., medical imaging, where an image of a biometric surface may be captured by an array of PMUT devices). In this manner, an array of PMUT devices may be operated at a suitable power and frequency to generate ultrasonic signals suitable for providing ultrasonic signals to a region of interest, receiving reflections of those signals, and generating a composite image based on the reflected signals.

A PMUT array may be fabricated according to semiconductor manufacturing processes as numerous PMUT transducers are arranged in a suitable pattern for a particular end-use application (e.g., dozens of PMUT transducers arranged adjacent to each other to perform fingerprint sensing). The adjacent PMUT transducers, and multiple PMUT device arrays formed from those PMUT transducers, are fabricated simultaneously as a substrate (e.g., a wafer) of material that progresses sequentially through processing operations such as deposition, doping, patterning, etching, and other standard operations.

An exemplary MEMS PMUT device (e.g., of a plurality of PMUT transducers) comprises a number of layers, including a piezoelectric layer of a material (e.g., that generates a mechanical response to an applied electrical signal (e.g., to generate a desired ultrasonic output signal) and an electrical signal in response to an applied mechanical force (e.g., from a received reflected ultrasonic signal). Exemplary piezoelectric materials include materials such as Aluminum Nitride (AlN), PVDF (poly vinylidene fluoride), poly(vinylidene fluoride-co-trifluoroethylene) (PVDF-TrFE), lead titanate (PbTiO3), Lead zirconate (PbZrO3 or PZT), sodium potassium niobite (K0.5Na0.5NbO3 or KNN), or bismuth layer-structured ferroelectrics (BLSF). The PMUT device may also include a processing layer that includes signal paths and signal processing circuitry (e.g., amplifiers, filters, etc.) for providing and receiving the electrical signals to and from the piezoelectric layer. In some embodiments, the processing layer may be a substrate or a portion of a substrate that other layers are deposited on and over during fabrication, such that a plurality of numerous PMUT transducers has the substrate processing layer (e.g., a CMOS substrate layer) as a base layer. Lower electrodes may overlay the processing layer and be located below the piezoelectric layer. One or more upper electrodes may overlay the piezoelectric layer such that respective portions of the piezoelectric layer are located between particular lower electrodes and the upper electrode (s). The processing circuitry may selectively control signals that are provided to the lower electrodes and upper electrode (s) to activate portions of the piezoelectric material to send (based on applying a transmit electrical signal between a lower electrode and an upper electrode) and receive (based on connecting a lower electrode and an upper electrode to a suitable electrical sense path) ultrasonic signals.

The piezoelectric material for multiple PMUT transducers of a wafer of PMUT transducers may be poled during the manufacture of the sensor. The lower electrodes may be permanent lower electrodes that are permanently applied (e.g., by deposition) prior to the deposition of the piezoelectric layer. In addition, prior to deposition of the piezoelectric layer over the permanent lower electrodes, temporary portions of conductive material (e.g., temporary electrodes) may be applied between the permanent lower electrodes to temporarily provide a continuous electrical connection between the permanent lower electrodes for individual PMUT devices or for all of the PMUT devices of a wafer of PMUT devices. The temporary electrode may be of a same or similar material to the permanent lower electrodes, or in some embodiments, may be of a different material that responds to different etching processes (e.g., such that a later-applied etching process removes the temporary electrode material but has no effect, or a limited effect, on the permanent lower electrode material). After the piezoelectric layer is deposited over the permanent lower electrodes and temporary electrodes, an upper electrode (e.g., a conductive layer or pattern) may be applied over the piezoelectric layer. In some embodiments, the upper electrode may be a continuous layer of material that is electrically connected during operation of a PMUT device (e.g., after a wafer of PMUT transducers is diced into a plurality of PMUT devices), while in some embodiments, some portions of the upper electrode material may also be removable prior to use in the field. In the context of a wafer of PMUT devices, the upper electrodes of the entire wafer of devices may be interconnected during processing or each PMUT device may have an individual continuous upper electrode during processing.

A voltage source may be applied to the interconnected permanent lower electrodes (e.g., the permanent lower electrodes and temporary electrodes) and the upper electrode. For example, the interconnected permanent lower electrodes may be connected to ground while a suitable poling signal is applied to the upper electrode, resulting in the generation of a suitable electrical field between the upper electrode and permanent lower electrode for poling of the intervening piezoelectric regions. The poling signal may be applied for a suitable duration and disconnected from the wafer. Applying the ground to the permanent lower electrodes that overlay the processing circuitry of the processing layer (e.g., a CMOS processing layer) may allow the permanent lower electrodes to function as a ground plane that protects the processing circuitry (e.g., lower voltage CMOS circuitry) from the poling signal and associated electric fields. In some embodiments, the temperature may also be controlled at an increased temperature (e.g., a Curie temperature for the material) that facilitates poling of the particular material. For example, a particular material (e.g., PVDF-TrFE) may have a poling temperature of 80-110 degrees Celsius, with a 90 kV/mm poling field and a 5-90 minute poling time.

Once the poling is complete, the temporary electrodes may be removed to create a desired pattern of isolated permanent lower electrodes. Portions of the upper electrode and the piezoelectric layer that overlay the temporary electrodes may be removed (e.g., by etching) to provide access to the temporary electrodes, which may be "cut" (e.g., by etching of a process type that does not remove the permanent lower electrode material) in order to isolate the permanent lower electrodes from each other. Any other methods suitable for removing (part of) the temporary electrodes while not removing the permanent lower electrodes, may be applied. For example, the temporary electrodes may be made of materials that are removed at a certain condition (e.g. certain temperature) or over time. In some embodiments, this processing may be performed in a manner that also performs desired processing to other layers, such as patterning particular shapes of piezoelectric materials, or isolating portions of the upper electrode layer from each other. Other processing such as filling the cavities that were formed by etching with desired epoxy materials (e.g., for matching with particular sensed materials such as skin for fingerprints) may also be performed. As a result of the processing, at least the isolated permanent lower electrodes may be individually connected to processing circuitry of the processing layer, for example, to allow individual transmitting and/or reception of ultrasonic signals. The upper electrode or electrodes may also be connected to suitable signals and/or circuitry.

FIG. 1 depicts an exemplary PMUT device system such as a fingerprint sensing system 100 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the PMUT device system may include at least a PMUT device 102 and supporting circuitry, such as processing circuitry 104 and memory 106. In some embodiments, one or more additional sensors 108 (e.g., MEMS gyroscopes, MEMS accelerometers, MEMS pressure sensors, and a compass) may be included within the fingerprint sensing system 100.

Processing circuitry 104 may include one or more components providing necessary processing based on the requirements of the fingerprint processing system 100. In some embodiments, processing circuitry 104 may include hardware control logic that may be integrated within a chip of a sensor (e.g., within a processing layer of a PMUT device 102, or on a portion of a chip adjacent to the PMUT device 102 and/or additional sensors 108) to control the operation of the PMUT device 102 or additional sensors 108 and perform aspects of processing for the PMUT device 102 or additional sensors 108. In some embodiments, the PMUT device 102 and additional sensors 108 may include one or more registers that allow aspects of the operation of hardware control logic to be modified (e.g., by modifying a value of a register). For example, in some embodiments, one or more registers may be modified to change values (e.g., resistors, capacitors, filters, etc.) associated with the processing circuitry described herein. In some embodiments, processing circuitry 104 may also include a processor such as a microprocessor that executes software instructions, e.g., that are stored in memory 106. The microprocessor may control the operation of the PMUT device 102 by interacting with the hardware control logic and process signals received from PMUT device 102. The microprocessor may interact with other sensors in a similar manner. A bus 120 may provide for communication between the fingerprint processing system (including components thereof) and other related components and devices.

Figure 2:
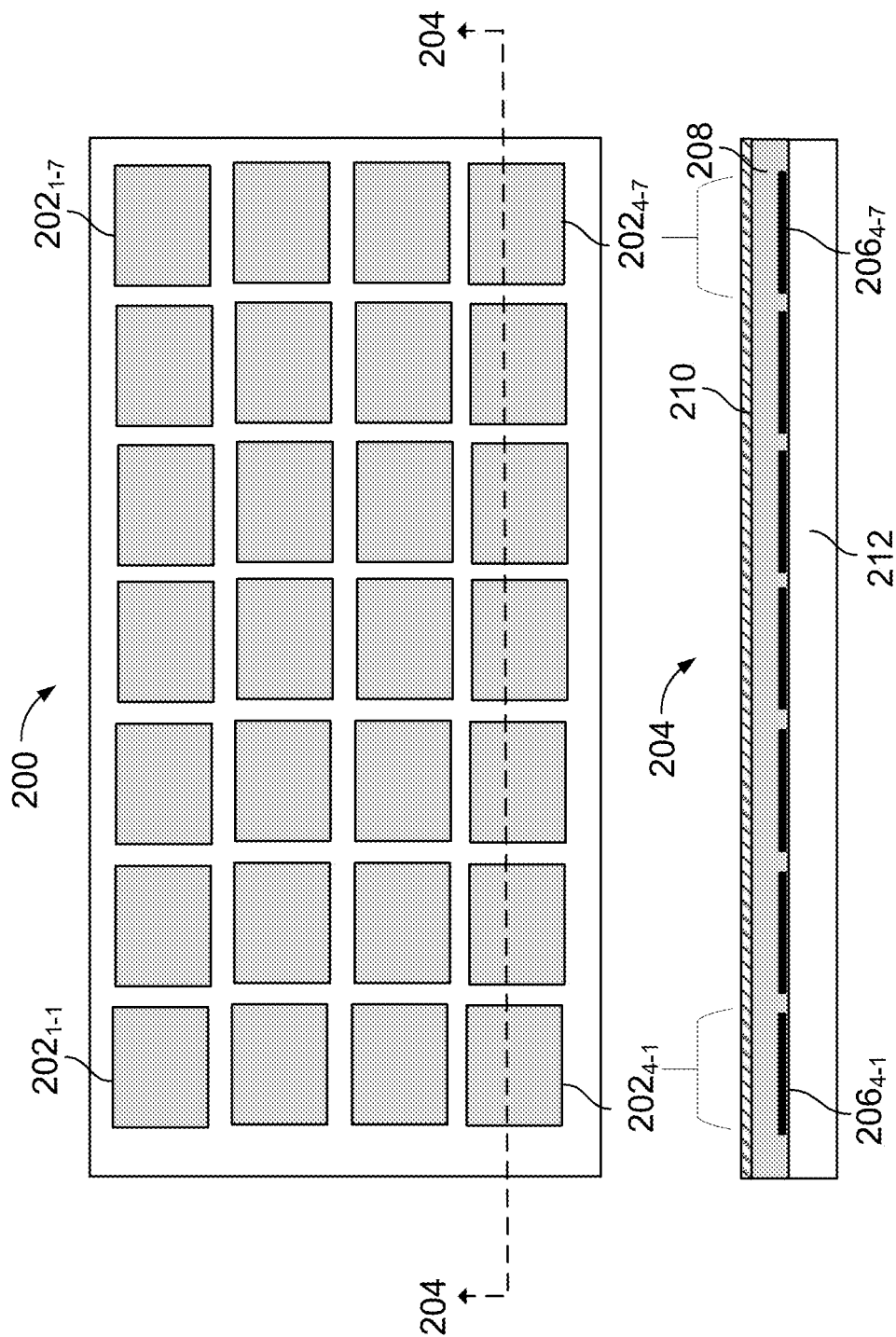
FIG. 2 shows an exemplary array of PMUT transducers in accordance with an embodiment of the present disclosure.

FIG. 2 shows an exemplary array of PMUT transducers in accordance with an embodiment of the present disclosure. In the exemplary depiction of FIG. 2, an array of PMUT transducers collectively form a PMUT fingerprint sensor 200. Although the present disclosure may be described in the context of PMUT fingerprint sensing, it will be understood that PMUT ultrasonic sensing can be applied to a variety of applications and materials. Furthermore, the techniques described herein may also by applied to non-ultrasonic applications. In the simplified depiction of FIG. 2, the PMUT fingerprint sensor 200 comprises a rectangular grid of rectangular PMUT transducers $202_{1-1}$-$202_{4-7}$. It will be understood that PMUT transducers may have a variety of shapes and configurations (e.g., square, circular, donut, etc.) to transmit and receive particular ultrasonic signal patterns, that PMUT transducers may be arranged in a variety of patterns in PMUT devices such as fingerprint sensors, and that PMUT technology may be utilized for numerous applications. In the exemplary embodiment of FIG. 2, the PMUT transducers $202_{1-1}$-$202_{4-7}$ form a 4×7 grid that is approximately the size of a typical fingerprint or relevant portion thereof, and selectively sends and receives ultrasonic signals (e.g., based on selective switching by circuitry within processing layer 212) to capture the location and contours of a fingerprint (or other material under observation) that is placed over the PMUT fingerprint sensor 200.

Section view 204 depicts one of the rows of PMUT transducers (i.e., row 4, corresponding to PMUT transducers $202_{4\text{-}1}$-$202_{4\text{-}7}$). In the simplified section view 204, a processing layer 212 includes processing circuitry for sending and receiving of electrical signals to actuate or receive ultrasonic signals, performing switching for PMUT transducers (e.g., to switch between transmit and receive modes), and perform processing for transmitted and received signals. Although the processing layer 212 of the PMUT fingerprint sensor 200 is depicted as a lower structural layer of the sensor, in some embodiments some or all of the processing described as performed in the processing layer 212 may be performed by other circuitry, such as on an adjacent or stacked chip or die. In some embodiments, an additional substrate support layer may be located below the processing layer 212.

In the exemplary embodiment of FIG. 2, each of the PMUT transducers $202_{4\text{-}1}$-$202_{4\text{-}7}$ is associated with a portion of an upper electrode 210, a portion of a piezoelectric layer 208, and a respective lower electrode $206_{4\text{-}1}$-$206_{4\text{-}7}$. The upper electrode 210 forms a common conductive layer that may be switched between different voltages (e.g., by a connection to processing layer 212, not depicted in FIG. 2). Each of the respective lower electrodes $206_{4\text{-}1}$-$206_{4\text{-}7}$ may be individually controlled by processing circuitry 212. By selectively applying different potentials and/or connections to the upper electrode 210 and lower electrodes $206_{4\text{-}1}$-$206_{4\text{-}7}$, different portions of the piezoelectric layer 208 may be selectively caused to function as transmitters or receivers for ultrasonic signals, in a variety of signal patterns and types. It will be understood that in other embodiments (not depicted in FIG. 2), other configurations of upper electrode 210 (e.g., individually controllable and accessible upper electrodes), piezoelectric layer 208 (e.g., including gaps between adjacent transducers, particular patterns or anchoring points, etc.), and lower electrodes $206_{4\text{-}1}$-$206_{4\text{-}7}$ may be utilized, and that the simplified depiction of FIG. 2 is exemplary only. Further, it will be understood that a PMUT transducer may include multiple additional layers in addition to the depicted layers in FIG. 2 and this description, such as seed layers, structural layers, bonding layers, ultrasonic transmit layers, ultrasonic receive layers, and/or multiple upper or lower electrode layers (e.g., separate transmit and receive layers constructed of different piezoelectric materials) layered over or between the layers and components specifically discussed herein. For example, in some embodiments different materials (e.g., different piezoelectric materials) and designs may be used for dedicated send and transmit transducers, while in other embodiments the transducers can be of a common piezoelectric material and design for send and receive, with switching performed between send and receive modes. In some embodiments, the different layers used for transmitting and receiving ultrasound waves may not use PMUT transducers, but may instead utilize other (e.g., film-based) methods.

Figure 3:
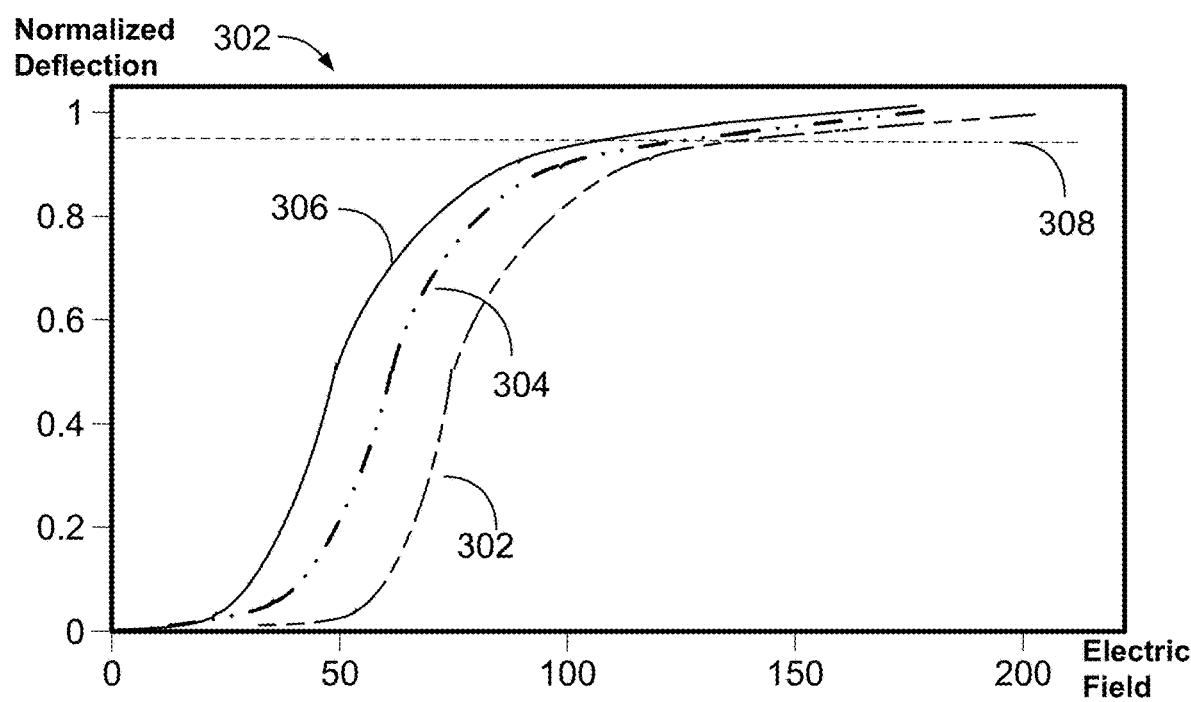
FIG. 3 shows an exemplary plot of poling responses to different poling electric fields in accordance with some embodiments of the present disclosure.

FIG. 3 shows an exemplary plot of poling responses to different poling electric fields in accordance with some embodiments of the present disclosure. In the exemplary plot of FIG. 3, a plurality of poling response curves 302, 304, and 306 are depicted for an exemplary piezoelectric material. The abscissa of FIG. 3 corresponds to an applied electric field in units of volts per micrometer, while the ordinate of FIG. 3 corresponds to a normalized free-end deflection of the poled piezoelectric material. A first poling response curve 302 depicts the normalized free-end deflection (e.g., corresponding to a degree of common orientation of piezoelectric dipoles for the piezoelectric material) for a particular electric field applied over a first period of time (e.g., 1 minute), a second poling response curve 304 depicts the normalized free-end deflection for a particular electric field applied over a first period of time (e.g., an order of magnitude greater than the poling time for poling response curve 302, such as 10 minutes), and a third poling response curve 306 depicts the normalized free-end deflection for a particular electric field applied over a third period of time (e.g., an order of magnitude greater than the poling time for poling response curve 304, such as 100 minutes).

As is depicted in FIG. 3, at lower electric fields such as 50 V/μm, the effectiveness of the poling varies substantially the longer the electric field is applied to the piezoelectric material, for example by multiple orders of magnitude. However, as the electric field increases to a particular level (e.g., in the exemplary embodiment of FIG. 3, at or above 100 V/μm), an increase in poling duration has relatively minimal impact on the effectiveness of the poling. Accordingly, increasing the electric field that can be applied during a poling process substantially decreases (e.g., by orders of magnitude) the processing time for poling of piezoelectric materials.

FIGS. 4A through 11 depict exemplary semiconductor processing steps performed in constructing an array of PMUT transducers in accordance with some embodiments of the present disclosure. Although particular material layers and processing steps are depicted in these figures in a particular order, it will be understood that in some embodiments additional processing steps may be added (e.g., pre-processing and post-processing steps for deposition of layers, seed and structural layers, etching of material layers, and the like), processing steps may be removed, and/or the order of processing steps may be modified.

Figure 4A:
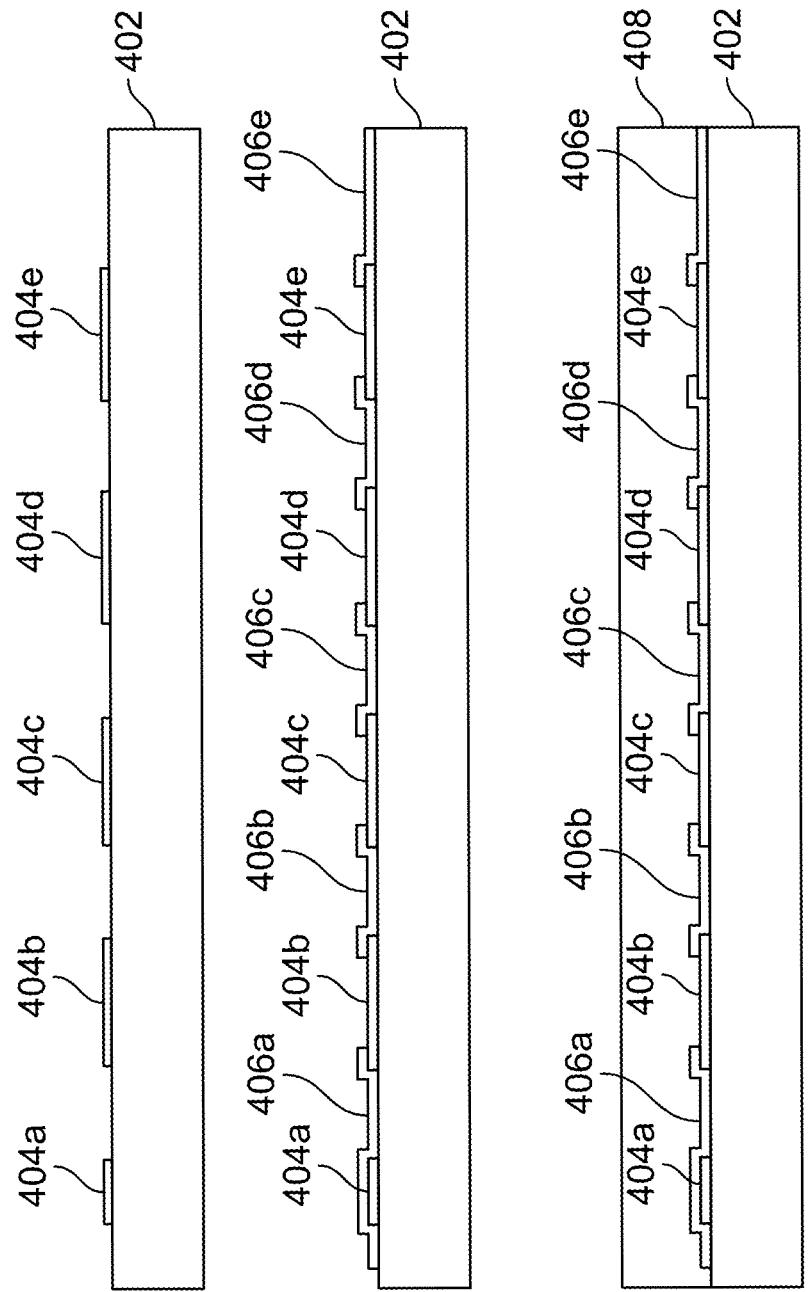
FIG. 4A shows exemplary steps of depositing electrode and piezoelectric layers of a PMUT device in accordance with some embodiments of the present disclosure.

FIG. 4A shows exemplary steps of depositing electrode and piezoelectric layers of a PMUT device in accordance with some embodiments of the present disclosure. A wafer of a processing layer 402 functions as a base layer for the further processing steps described herein. In an embodiment, the processing layer may include hardware-implemented processing circuitry such as CMOS processing circuitry, by which the control and processing functions of the processing layer (e.g., switches, amplifiers, filters, A/D conversion, etc.) may be performed, and that distributes signals within the PMUT device and for interface with external circuitry. As depicted in the top image of FIG. 4A, a set of permanent lower electrodes 404a-404e may be deposited over the processing layer 402, such that each of the electrodes 404a-404e is electrically connected to a portion of the processing circuitry within processing layer 402 to receive signals from the processing circuitry (e.g., to send electrical signals to activate a piezoelectric layer associated with each respective permanent lower electrode) and to provide signals to the processing circuitry for processing (e.g., to receive electrical signals generated by a portion of a piezoelectric layer receiving an ultrasonic stimulus). Exemplary materials for the permanent lower electrodes include materials that are not removed while other materials are selectively etched. For example, CMOS processing circuitry materials such as copper or aluminum may be utilized as permanent lower electrode materials.

The middle image of FIG. 4A depicts deposition of a temporary electrodes 406a-406e over the permanent lower electrodes 404a-404e and over portions of the processing layer 402. As depicted in FIG. 4A, each temporary electrode 406a-406e is physically and electrically connected between two of the respective permanent lower electrodes 404a-404e (e.g., temporary electrode 406a is connected to permanent lower electrodes 404a and 404b, temporary electrode 406b is connected to permanent lower electrodes 404b and 404c, temporary electrode 406c is connected to permanent lower electrodes 404c and 404d, temporary electrode 406d is connected to permanent lower electrodes 404d and 404d, and temporary electrode 406a is connected to permanent lower electrode 404e and extends over an end portion of the processing layer 402). The temporary electrodes may be constructed of a material that has high etch selectivity with respect to the material of the permanent lower electrodes. For example, if permanent lower electrodes are of a material such as aluminum or copper, exemplary temporary electrode materials may include materials (e.g., chromium, titanium, or indium tin oxide (ITO)) with high etch selectivity with respect to the permanent lower electrode materials In some embodiments, the materials for the permanent lower electrodes and temporary electrodes may be selected such that while both materials are conductive, the respective temporary electrodes and permanent lower electrodes are removed by different processes. For example, the temporary electrodes may be selectively etched by a suitable dry or wet etching process. In this manner, the temporary electrodes may be utilized for poling during sensor manufacturing as described herein but may be later processed to remove the temporary electrodes or portions thereof, thus removing the electrical connections between respective permanent lower electrodes.

In some embodiments (not depicted), the permanent lower electrodes and the temporary electrodes comprise a common material layer, which may be deposited in a single step (e.g., as a single layer of material). The common material layer may be continuous between the respective permanent lower electrodes and temporary electrodes. In such embodiments, the portions of the common material layer that are removed during later processing steps correspond to the temporary electrodes while portions of the common material layer that are retained correspond to the permanent lower electrodes.

As depicted in the bottom image of FIG. 4A, a layer of piezoelectric material 408 such as a PVDF material (e.g., PVDF-TrFE) may be deposited over the permanent lower electrodes 404a-404e and temporary electrodes 406a-406e, followed by appropriate processing of the piezoelectric layer 408 (e.g., soft baking). In other applications, layer 408 may include another type of material that is not a piezoelectric material. Although in the side section view of FIG. 4A, the piezoelectric layer 408 is depicted as overlaying the permanent lower electrodes 404a-404e and temporary electrodes 406a-406e, in some embodiments the piezoelectric layer 408 may also be deposited over portions of the processing layer 402. For example, the permanent lower electrodes 404a-404e may be deposited in a pattern (e.g., as depicted in FIG. 2) over portions of the processing layer 402, and the temporary electrodes 406a-406e may connect those portions electrically but do not necessarily form an electrically conductive layer overlaying the entirety of the processing layer 408 and permanent lower electrodes 404a-404e. Therefore, in some locations layer 408 may be in direct contact with processing layer 402 and the temporary electrodes may primarily form electrical connections between adjacent permanent lower electrodes.

Figure 4B:
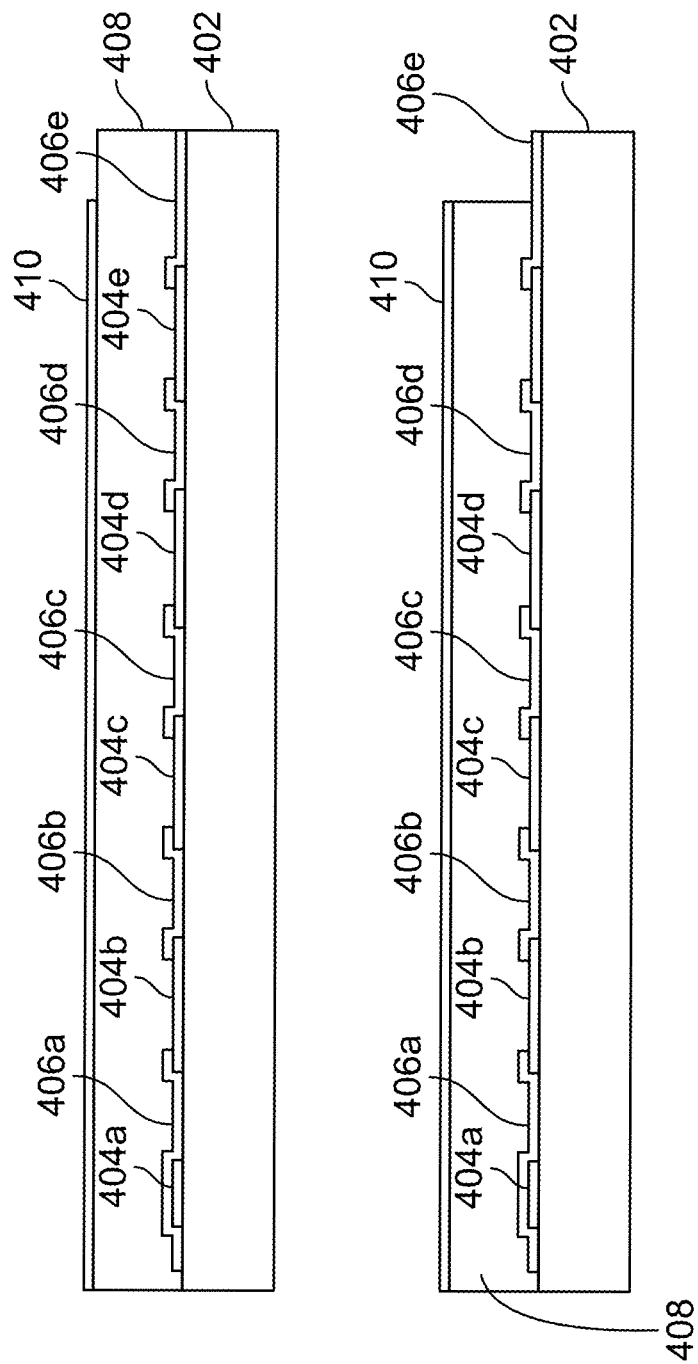
FIG. 4B shows exemplary steps of depositing an upper electrode layer and removing a portion of the piezoelectric layer in accordance with some embodiments of the present disclosure.

FIG. 4B shows exemplary steps of depositing an upper layer and removing a portion of the piezoelectric layer in accordance with some embodiments of the present disclosure. As depicted in FIG. 4B, an upper electrode 410 may be deposited over the piezoelectric layer 408, although in some embodiments additional processing steps and/or layers may be involved in the preparation, deposition, and patterning of the upper electrode 410. In an exemplary embodiment described herein, the top electrode 410 may be a conductive electrode layer that substantially overlays the entire piezoelectric layer 408 and provides a single common potential (e.g., as supplied by an electrical connection to a permanent lower electrode as described herein). It will be understood that the upper electrode 410 may adopt different shapes and patterns, and in some embodiments multiple electrically isolated upper electrodes may be deposited and/or patterned to allow individual control of the respective upper electrodes. In an embodiment of the present disclosure, as depicted in the bottom image of FIG. 4B, once the upper electrode 410 is patterned over the piezoelectric layer 408, a portion of the piezoelectric layer 408 may be removed (e.g., by oxygen plasma or $O_2$ reactive ion etching) to expose a portion of the lower electrodes that will be removed, such as a temporary electrode 406e.

Figure 5:
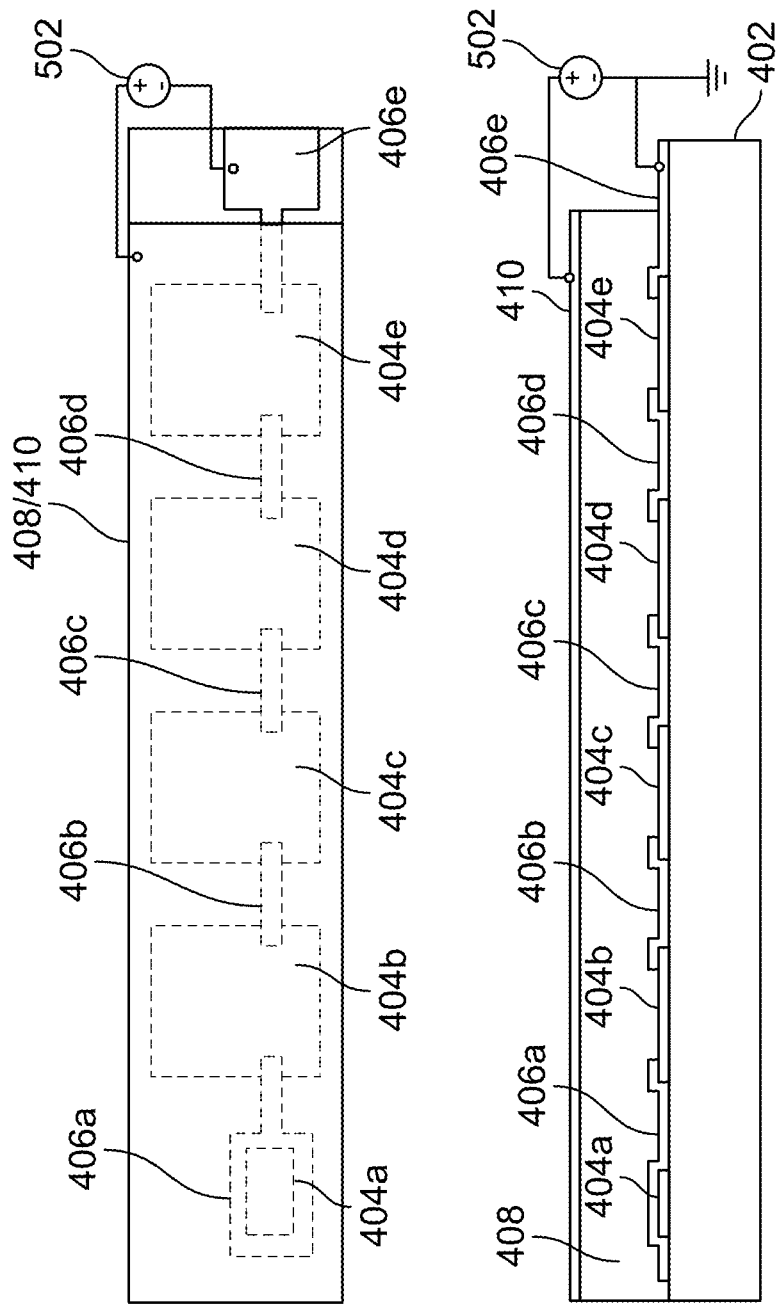
FIG. 5 shows an exemplary configuration for poling a piezoelectric layer in accordance with some embodiments of the present disclosure.

FIG. 5 shows an exemplary configuration for poling a piezoelectric layer in accordance with some embodiments of the present disclosure. The upper portion of the drawing depicts a top view and the lower portion depicts a section view of the PMUT array described herein. For ease of depiction, the PMUT array includes a single row of four PMUT transducers (e.g., associated with permanent lower electrodes 404b, 404c, 404d, and 404e), although it will be understood that a PMUT array and/or PMUT device constructed from a PMUT array may include a variety of shapes and configurations of PMUT transducers.

As is depicted in FIG. 5, each of the permanent lower electrodes 404b-404e has a shape that defines the portions of the piezoelectric material that sends or receives ultrasonic signals, i.e., based on the activation of the respective permanent lower electrode with an electrical activation signal or the connection of the respective permanent lower electrode to sense circuitry. As will be described herein, permanent lower electrode 404a will later be connected to upper electrode 410 to connect the upper electrode to an appropriate electrical signal path of processing circuitry of the processing layer 402. For purposes the processing of FIG. 5, the permanent lower electrodes 404a-404e are electrically interconnected via the temporary electrodes 406a-406b, and the permanent lower electrode 406a (or any of the other permanent lower electrodes) is not yet electrically connected to the upper electrode 410.

In some embodiments, a poling voltage source 502 may be applied to the PMUT array and all of the respective PMUT transducers in order to pole the portions of the piezoelectric layer 408 that are located between the interconnected electrodes overlaying the processing layer 402 (e.g., the permanent lower electrodes 404a-404e and the temporary electrodes 406a-406e) and the upper electrode 410. Although not depicted in FIG. 5, in addition to applying the voltage source 502 to the PMUT array, other appropriate poling conditions may be controlled, such as increasing the temperature of the PMUT array to a temperature suitable for poling (e.g., above a Curie temperature for the particular piezoelectric material).

In some embodiments, the poling voltage source 502 may be applied to the PMUT array by applying one terminal of the poling voltage source 502 to the upper electrode 410 and the other terminal of the poling voltage source 502 to temporary electrode 406e. Although a variety of poling voltages and voltage patterns may be applied to the PMUT array (e.g., DC signals, periodic signals, time varying DC signals, etc.), a suitable DC voltage may be applied to the upper electrode 410, and the temporary electrode 406e (and thus, the temporary electrodes 406a-406d and permanent lower electrodes 404a-404e) may be connected to ground. The poling voltage may be applied to the PMUT array for a suitable amount of time to obtain a degree and consistency of alignment of the dipoles of the piezoelectric material layer 408 (e.g., vertical alignment between the lower electrodes and upper electrodes in the exemplary embodiment of FIG. 5). In an exemplary embodiment of a PVDF-TrFE piezoelectric material layer 408, exemplary poling parameters include a poling temperature of 80-110 degrees Celsius, a 90 kV/mm poling field, and a 5-90 minute poling time.

Although the DC voltage or other polling signal may be applied to the lower electrodes in some embodiments, in an exemplary embodiment, an operation voltage of the processing layer 402 (e.g., a CMOS processing layer) may be substantially lower (e.g., approximately an order of magnitude or more) than the voltage of the applied signal. The permanent lower electrodes 404a-404e are permanently electrically connected to the processing layer 402, and thus any signal applied to the lower electrodes (e.g., via the temporary electrodes 406a-406d) will also be transmitted to at least a portion of the processing circuitry of the processing layer 402. Connecting the lower electrodes to ground prevents the poling voltage from being transmitted through to the processing layer 402 and also functions as a partial ground plane to protect the processing layer 402 from the electrical fields generated during poling.

Figure 6:
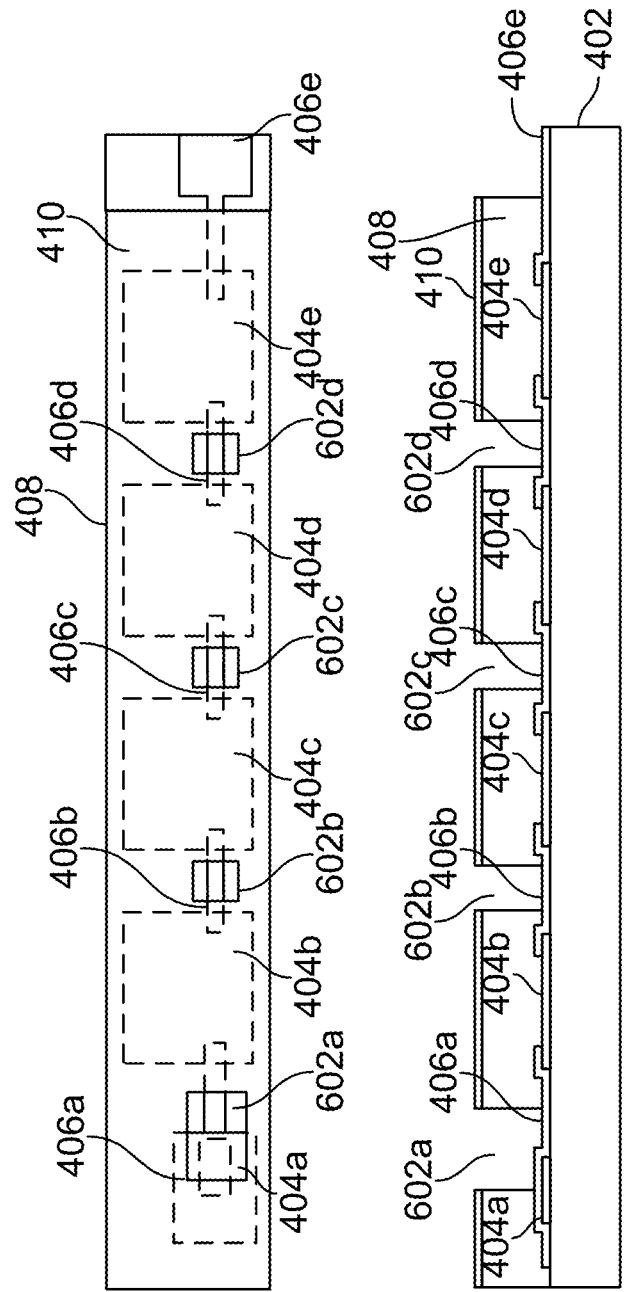
FIG. 6 shows exemplary steps for selectively etching portions of a piezoelectric layer in accordance with some embodiments of the present disclosure.

FIG. 6 shows exemplary steps for selectively etching portions of a piezoelectric layer in accordance with some embodiments of the present disclosure. Once the operations of FIG. 5 are complete, at least the portions of the piezoelectric layer 408 that are associated with the respective permanent lower electrodes 404a-404e may be have undergone poling, such that the dipoles of the piezoelectric materials are substantially aligned (e.g., vertically between the lower electrodes and upper electrodes) to facilitate the transmission and reception of ultrasonic signals. Once the poling process is complete, the operations depicted and described for FIGS. 6-8 may complete the manufacture of the PMUT device, by selectively removing portions of the temporary electrodes 406a-406e to electrically isolate the respective permanent lower electrodes 404a-404e and by electrically connecting the upper electrode 410 to the processing layer 402 via one or more of the permanent lower electrodes (e.g., permanent lower electrode 404a).

In some embodiments of the present disclosure, portions of one or more layers of the partially fabricated PMUT array may be removed to access portions of the temporary electrodes 406a-406e that form the electrical connections between the respective permanent lower electrodes 404a-404e (e.g., any layers located between the upper surface of the partially fabricated PMUT array and the temporary electrodes). In the exemplary embodiment of FIG. 6, portions of the upper electrode 410 may be patterned to expose portions of the piezoelectric layer, which may then be etched (e.g., dry etched with $O_2$ plasma) to create access locations 602a-602d, each associated with a respective temporary electrode 406a-406d, with a portion of temporary electrode 406e already exposed by the etching described with respect to FIG. 4B.

Figure 7:
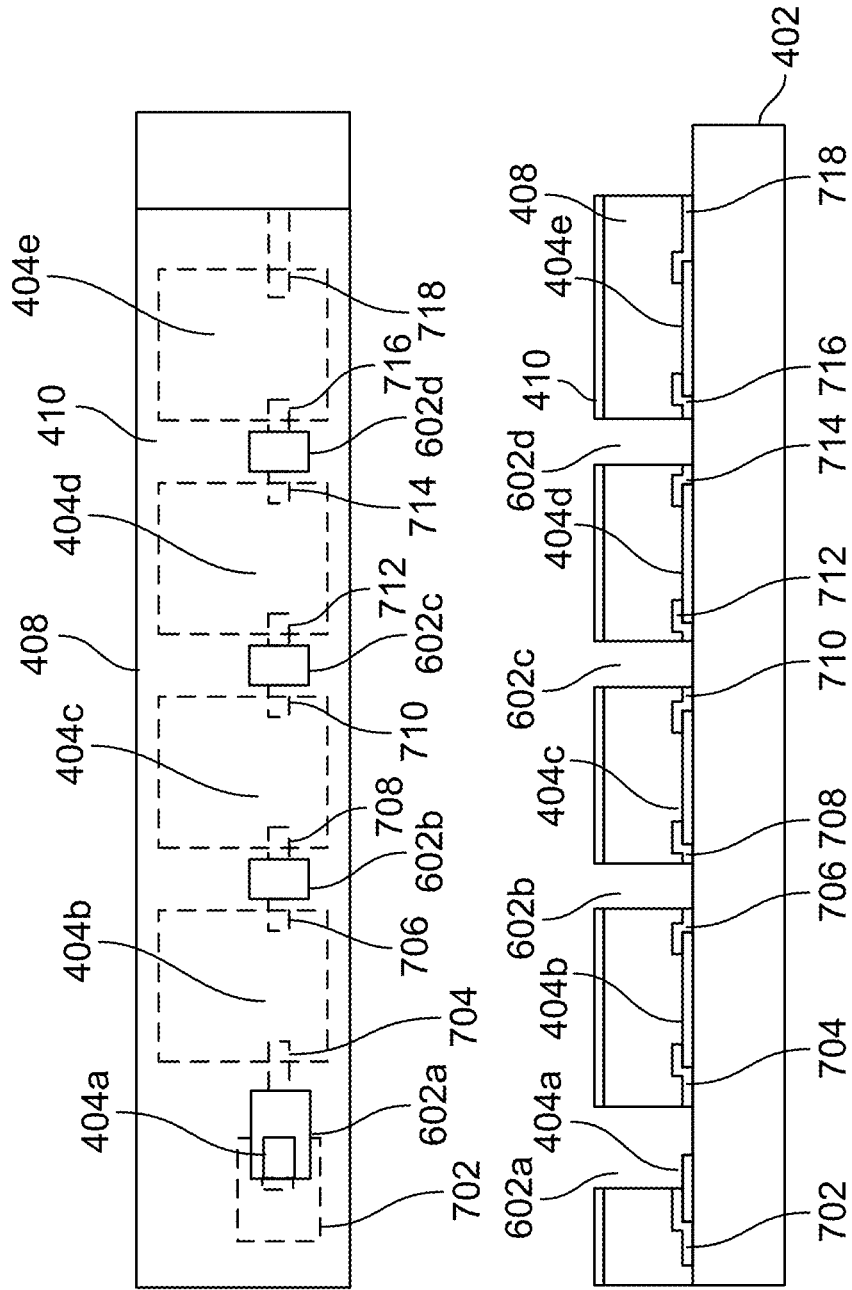
FIG. 7 shows exemplary steps for selectively etching portions of temporary electrodes in accordance with some embodiments of the present disclosure.

FIG. 7 shows exemplary steps for selectively etching portions of temporary electrodes in accordance with some embodiments of the present disclosure. Once the portions of the temporary electrodes 406a-406e are exposed for further processing, these portions may be selectively etched as depicted in FIG. 7. The portions of the temporary electrodes 406a-406e that are directly accessible via the access locations 602a-602d and the opening above temporary electrode 406e may be etched by a suitable process that selectively etches the temporary electrodes. In an exemplary embodiment, the permanent lower electrodes 404a-404e are of a material that is not reactive with the etching process and materials used to remove the temporary electrodes, such that any portions of the permanent lower electrodes that are exposed to the etching of the temporary electrodes (e.g., permanent lower electrode 404a) are not removed or otherwise damaged by the etching of the temporary electrodes. As a result of the partial etching of the temporary electrodes 406a-406e, each of the permanent lower electrodes 404a-404e is electrically isolated from all of the other permanent lower electrodes 404a-404e, as the remaining temporary electrode stub portions 702-718 do not connect the permanent lower electrodes to each other (e.g., temporary electrode stub portion 702 is connected only to permanent lower electrode 404a, temporary electrode stub portions 704 and 706 are connected only to permanent lower electrode 404b, temporary electrode stub portions 708 and 710 is connected only to permanent lower electrode 404c, temporary electrode stub portions 712 and 714 are connected only to permanent lower electrode 404d, and temporary electrode stub portions 716 and 718 are connected only to permanent lower electrode 404e).

Figure 8:
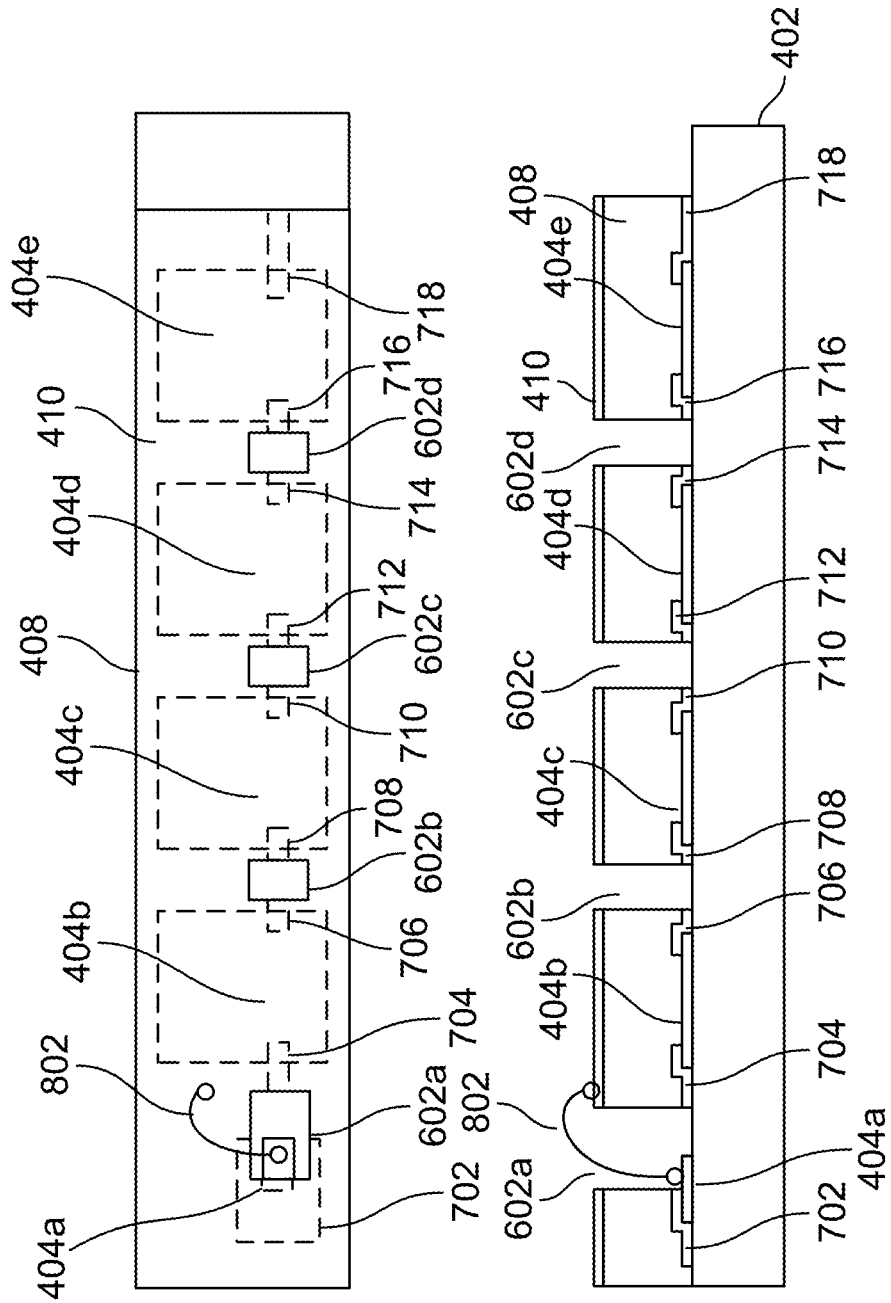
FIG. 8 shows exemplary steps for bonding the upper electrode layer to one of the permanent lower electrodes in accordance with some embodiments of the present disclosure.

FIG. 8 shows exemplary steps for bonding the upper electrode layer to one of the permanent lower electrodes in accordance with some embodiments of the present disclosure. In some embodiments, one of the lower electrodes (e.g., permanent lower electrode 404a) may be connected to the upper electrode 410. Although the connection between the permanent lower electrode 404a may be formed in a variety of manners (e.g., a conductive via), in the exemplary embodiment of FIG. 8, the permanent lower electrode 404a is connected to the upper electrode 410 by a wirebond 802 between permanent lower electrode 404a and upper electrode 410. Permanent lower electrode 404a is connected to processing circuitry of the processing layer 402, which in turn allows the upper electrode to be connected to appropriate signals and circuitry for sending and receiving ultrasonic signals through excitation of portions of the piezoelectric layer 408.

In the exemplary embodiment of FIG. 8, a plurality of PMUT transducers may be associated with the plurality of permanent lower electrodes 404b-404e. The processing circuitry of the processing layer 402 is directly connected to each of the permanent lower electrodes 404b-404e and is connected to the upper electrode 410 (e.g., via permanent lower electrode 404a and wirebond 802) in order to control the sending and receiving of ultrasonic signals at the regions of the piezoelectric layer 408 that are located between any of the permanent lower electrodes 404b-404e and the upper electrode 410. In this example, a single upper electrode is used and connected to the processing and control circuitry through permanent lower electrode 404a. In other embodiments, the upper electrode may be segmented which means that for each segment the upper electrode is separately connected to the control and processing circuitry by respective lower permanent lower electrodes and wirebonds/vias. For example, for each permanent lower electrode that has a corresponding upper electrode, a connection to the processing circuitry for each lower-upper electrode pair is utilized.

Figure 9:
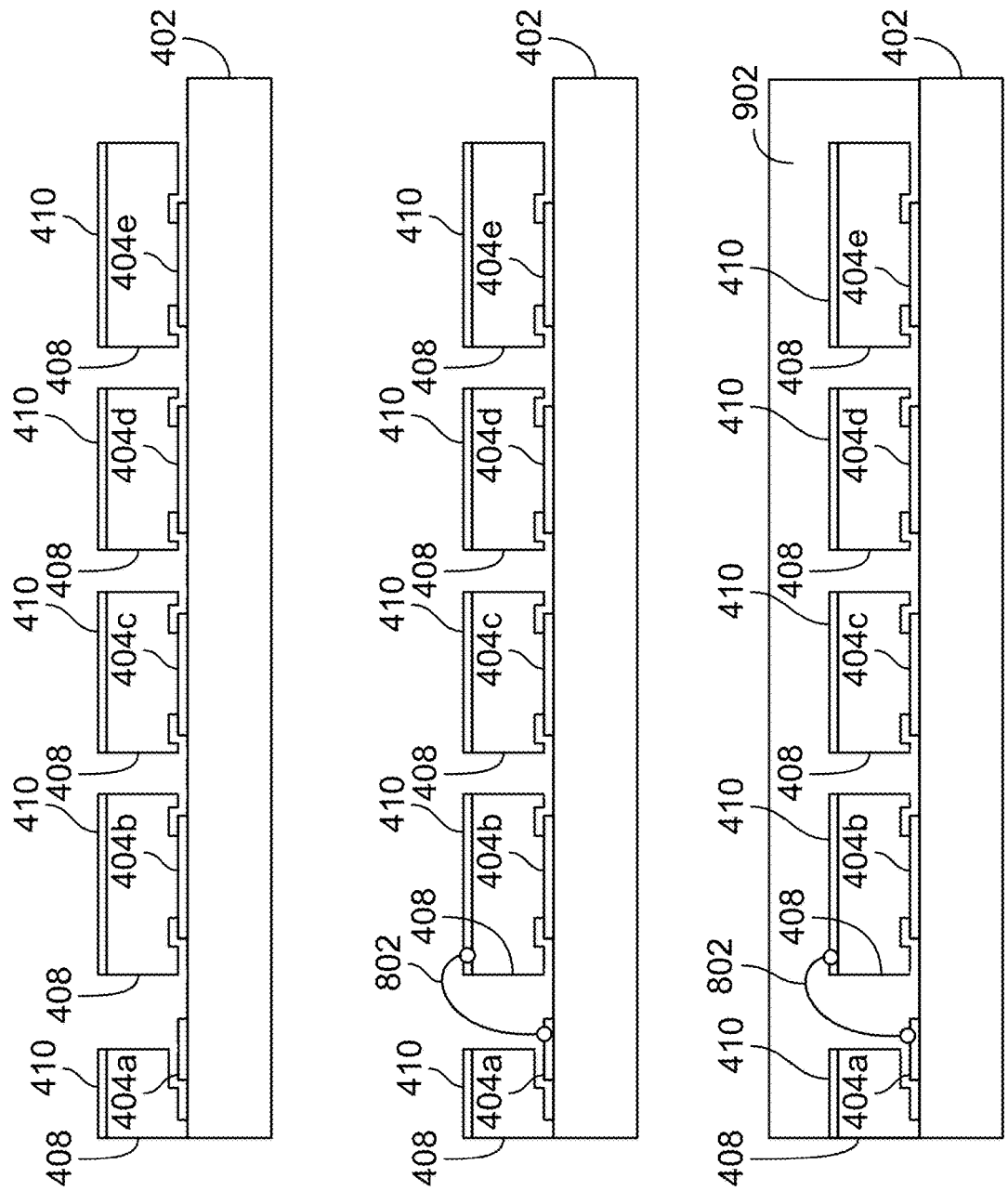
FIG. 9 shows exemplary steps for removing temporary electrodes and applying an epoxy coating layer in accordance with some embodiments of the present disclosure.

FIG. 9 shows exemplary steps for removing temporary electrodes and applying a filler material layer (e.g., an epoxy coating layer) in accordance with some embodiments of the present disclosure. A suitable filler material layer may provide acoustic impedance matching between the piezoelectric material and the target material (e.g., skin of a finger), for example, with an acoustic impedance between the corresponding acoustic impedance of the piezoelectric material and the target material. Although in some embodiments, the epoxy coating layer may be applied without removing the entirety of the temporary electrodes, in the exemplary embodiment of FIG. 9, the temporary electrodes are removed in their entirety prior to applying the epoxy coating layer. This limits the possibility of the temporary electrodes modifying the characteristics of transmitted or received ultrasonic signals, as well as limiting exposure to parasitic or other signals. The entirety of the temporary electrodes may be removed, for example, by extending the time period for the etching of the temporary electrodes.

In an embodiment, as is depicted in the upper drawing of FIG. 9, the entirety of the temporary electrodes 406a-406e are removed, leaving only the permanent lower electrodes 404a-404e located on the upper surface of the processing layer 402. The permanent lower electrode 404a may be electrically connected to the upper electrode 410 (e.g., via wirebond 802), such that each of the respective permanent lower electrodes 404b-404e associated with a respective PMUT transducer and the upper electrode 410 are in communication with and controllable by the processing circuitry of the processing layer 402. A filler material layer 902 such as an epoxy coating layer may then be coated over the PMUT array, filling the etched cavities of the previous locations of the temporary electrodes and the access cavities through the upper electrode 410 and piezoelectric layer 408. The epoxy layer may be selected and may be processed in a suitable manner (e.g., passivation) for impedance matching with a material of interest, such as human skin for a PMUT fingerprint sensor.

Figure 10:
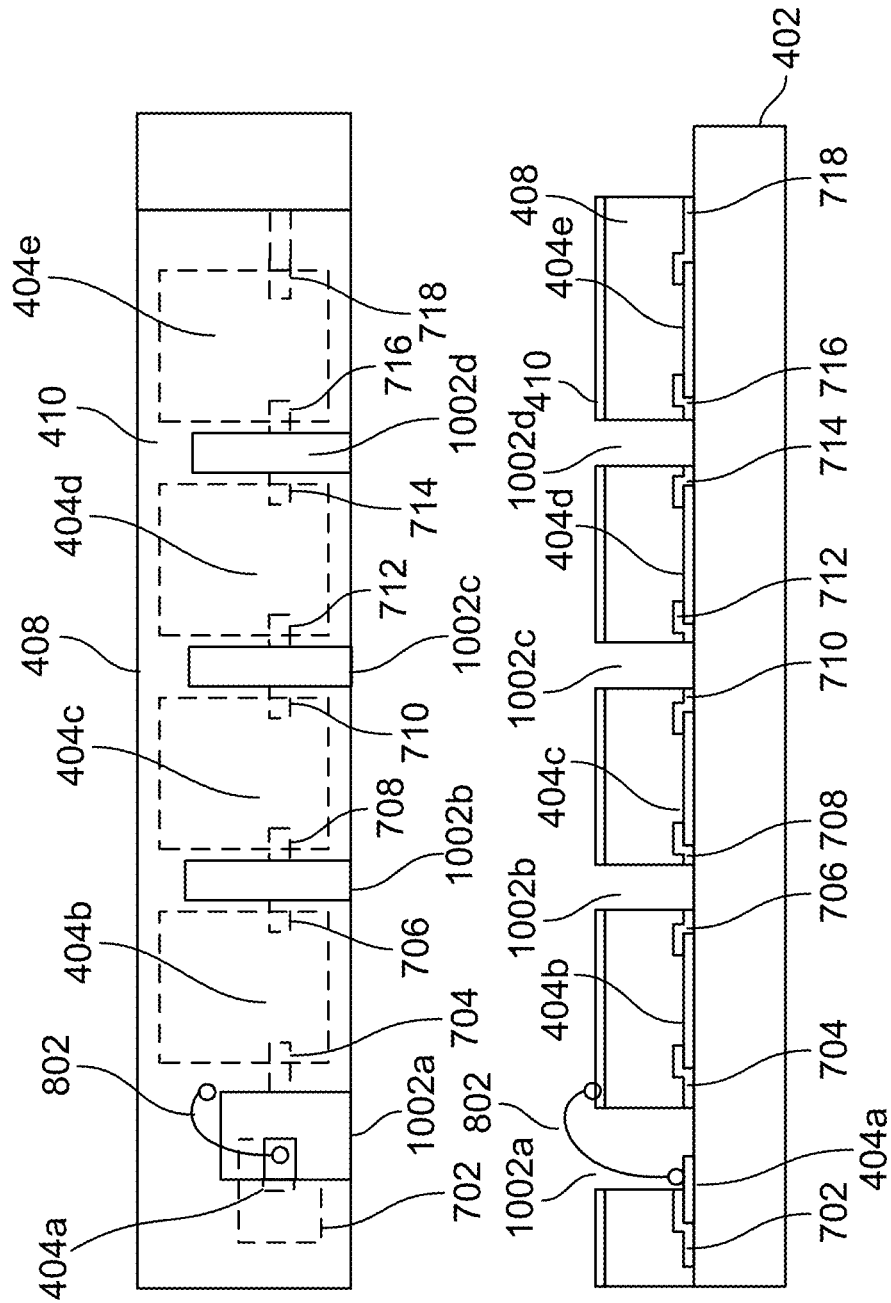
FIG. 10 shows exemplary steps for selectively patterning piezoelectric trenches in accordance with some embodiments of the present disclosure.

FIG. 10 shows exemplary steps for selectively patterning piezoelectric trenches in accordance with some embodiments of the present disclosure. The etched trenches that are used to access and remove some or all of the temporary electrodes may be performed in a variety of suitable shapes, for example, to provide isolation between adjacent regions of the piezoelectric layer 408 associated with respective permanent lower electrodes 404b-404e. For example, a portion of piezoelectric layer 408 overlaying permanent lower electrode 404b may be substantially isolated from the adjacent portion of piezoelectric layer 408 overlaying permanent lower electrode 404c by piezoelectric trench 1002b, a portion of piezoelectric layer 408 overlaying permanent lower electrode 404c may be substantially isolated from the adjacent portions of piezoelectric layer 408 overlaying permanent lower electrodes 404b and 404d by piezoelectric trenches 1002b and 1002c, a portion of piezoelectric layer 408 overlaying permanent lower electrode 404d may be substantially isolated from the adjacent portion of piezoelectric layer 408 overlaying permanent lower electrode 404c and 404e by piezoelectric trenches 1002c and 1002d, and a portion of piezoelectric layer 408 overlaying permanent lower electrode 404e may be substantially isolated from the adjacent portion of piezoelectric layer 408 overlaying permanent lower electrode 404d by piezoelectric trench 1002d. The piezoelectric trenches may extend to the processing layer 402 or to other intermediate layers (not depicted in FIG. 10), and may be formed in a variety of suitable shapes to provide desired isolation of adjacent piezoelectric portions (including to completely separate adjacent piezoelectric portions and/or isolate portions of the upper electrode for individualized connection) and to provide desired shapes and locations for the application of an epoxy coating layer (not depicted in FIG. 10).

Figure 11:
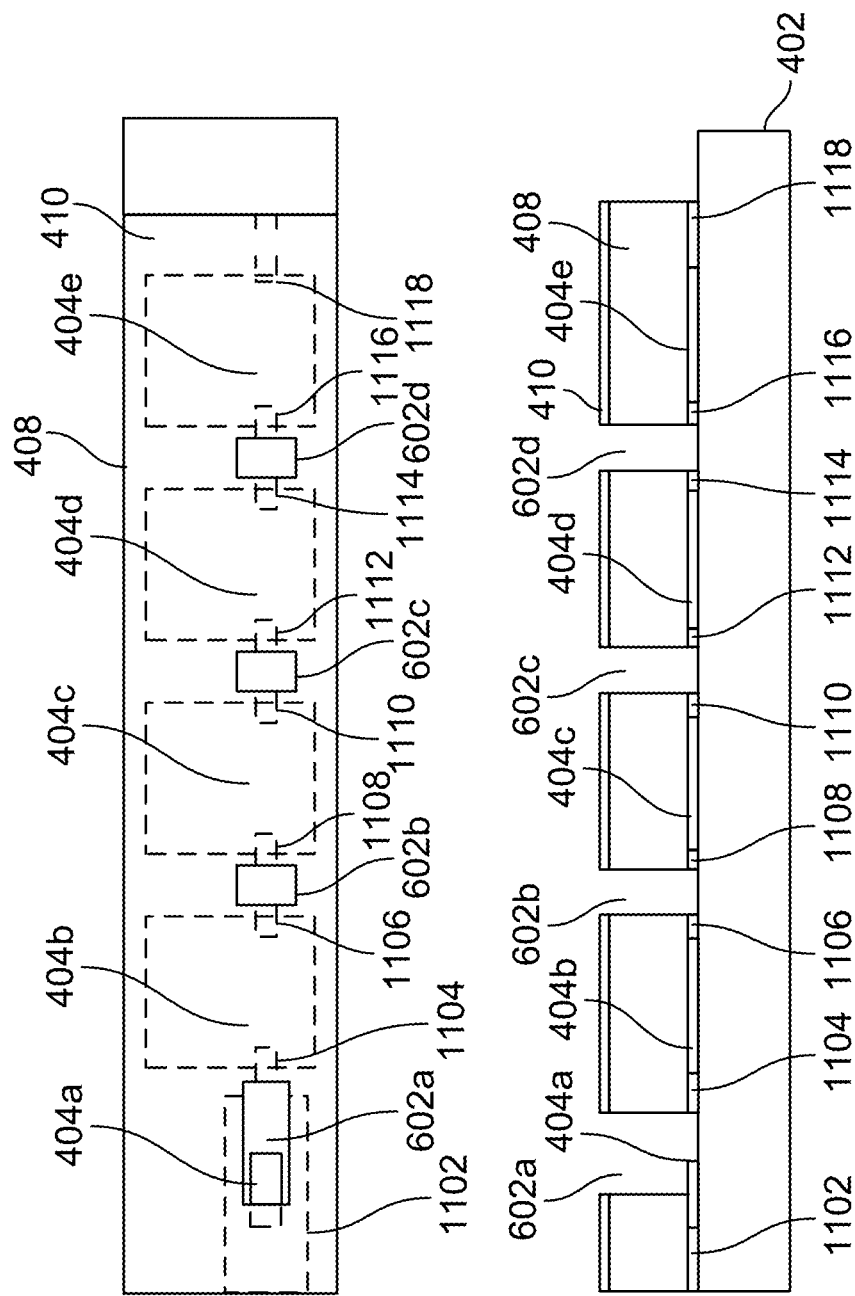
FIG. 11 shows an exemplary PMUT with temporary electrodes replaced with patterned CMOS electrodes in accordance with some embodiments of the present disclosure.

FIG. 11 shows an exemplary PMUT with temporary electrodes replaced with patterned CMOS electrodes in accordance with some embodiments of the present disclosure. The exemplary embodiment of FIG. 11 is similar to other embodiments described herein (e.g., FIG. 7), except that the temporary electrodes (e.g., temporary electrodes 406a-406e and temporary electrode portions 702-718) are replaced by a top metal of the processing layer 402 (e.g., CMOS top metal portions) that temporarily connect the permanent lower electrodes 404a-404e during poling and are later partially removed, resulting in top metal portion 1102 connected to permanent lower electrode 404a, top metal portions 1104 and 1106 connected to permanent lower electrode 404b and previously connecting permanent lower electrode 404b to permanent lower electrode 404a and permanent lower electrode 404c, top metal portions 1108 and 1110 connected to permanent lower electrode 404c and previously connecting permanent lower electrode 404c to permanent lower electrode 404b and permanent lower electrode 404d, top metal portions 1112 and 1114 connected to permanent lower electrode 404d and previously connecting permanent lower electrode 404d to permanent lower electrode 404c and permanent lower electrode 404e, and top metal portions 1116 and 1118 connected to permanent lower electrode 404e and previously connecting permanent lower electrode 404e to permanent lower electrode 404d and the now-removed terminal that was previously used for applying a potential to the previously interconnected lower electrodes during poling. The top metal electrodes may generally function in a similar manner as the temporary electrodes, except that they are formed from the processing layer (e.g., CMOS processing layer) top metal and require different processes for electrode removal.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A method for poling a piezoelectric layer of a wafer having a plurality of ultrasonic transducers, the method comprising:
   accessing a first terminal of the wafer, wherein the first terminal is electrically connected to a plurality of permanent lower electrodes of the wafer by a plurality of temporary electrodes of the wafer, wherein the plurality of permanent lower electrodes and the plurality of temporary electrodes overlay a substrate layer of the wafer, and wherein the plurality of permanent lower electrodes and the plurality of temporary electrodes are located below the piezoelectric layer;
   accessing an upper electrode of the wafer, wherein the upper electrode is located above the piezoelectric layer;
   applying a poling voltage between the first terminal and the upper electrode, wherein the poling voltage comprises a voltage suitable to modify piezoelectric dipoles of the piezoelectric layer;

disconnecting the poling voltage from the first terminal and the second terminal; and removing at least a portion of the temporary electrodes, wherein the plurality of permanent lower electrodes are not electrically connected to each other when the portions of the temporary electrodes are removed, and wherein each permanent lower electrode of the plurality of permanent lower electrodes corresponds to a respective one of the plurality of ultrasonic transducers.

2. The method of claim 1, wherein removing at least a portion of the temporary electrodes comprises:

removing a plurality of portions of the upper electrode;

removing a plurality of portions of the piezoelectric layer that are located below the plurality of portions of the upper electrodes;

accessing the plurality of temporary electrodes via the removed portions of the upper electrode and the piezoelectric layer; and removing the at least a portion of each of the temporary electrodes based on the accessing.

3. The method of claim 2, wherein removing the plurality of portions of the upper electrode comprises patterning the upper electrode, wherein removing the plurality of portions of the piezoelectric layer comprises etching the piezoelectric layer, and wherein removing the at least a portion of each of the temporary electrodes comprises etching the portions of the temporary electrodes.

4. The method of claim 3, wherein the permanent lower electrodes comprise a first material and the temporary electrodes comprise a second material, and wherein the first material is not removed in response to the etching of the portions of the temporary electrodes.

5. The method of claim 2, wherein the upper electrode remains electrically connected after the removing the plurality of portions of the upper electrode.

6. The method of claim 5, further comprising electrically connecting a first permanent lower electrode of the plurality of permanent lower electrodes to the upper electrode.

7. The method of claim 6, wherein electrically connecting a first permanent lower electrode of the plurality of permanent lower electrodes to the upper electrode comprises wire bonding the first permanent lower electrode to the upper electrode, wherein the wirebond extends through at least one of the removed portions of the piezoelectric layer.

8. The method of claim 6, further comprising applying a ground potential to the first permanent lower electrode.

9. The method of claim 2, wherein the upper electrode comprises a plurality of electrically isolated upper electrodes after the removing the plurality of portions of the upper electrode, further comprising electrically connecting each of the plurality of electrically isolated upper electrodes to a respective one of the permanent lower electrodes.

10. The method of claim 2, further comprising applying a layer of epoxy that replaces the removed portions of the upper electrode, the removed portions of the piezoelectric layer, and the removed portions of the temporary electrodes.

11. The method of claim 10, wherein an acoustic impedance of the layer of epoxy is matched to a material interest.

12. The method of claim 11, wherein the material of interest comprises skin of a fingerprint.

13. The method of claim 10, wherein the removed portions of the temporary electrodes comprise the entirety of the temporary electrodes.

14. The method of claim 1, further comprising selectively applying an activation signal between one or more of the permanent lower electrodes and the upper electrode, wherein each of the ultrasonic transducers is associated with one of the one or more of the permanent lower electrodes, a portion of the upper electrode, and a portion of the of the piezoelectric layer located between the associated permanent lower electrode and the portion of the upper electrode.

15. The method of claim 14, wherein the substrate layer comprises a CMOS layer, and wherein selectively applying the activation signal comprises:

applying a potential from the CMOS layer to the upper electrode; and selectively applying an activation signal from the CMOS layer to the one or more of the permanent lower electrodes.

16. The method of claim 1, wherein the modification of the piezoelectric dipoles comprises substantially aligning the piezoelectric dipoles of the piezoelectric layer.

17. The method of claim 1, wherein the permanent lower electrode and the temporary electrode comprise a common material layer, and wherein the removing the at least a portion of each of the temporary electrodes comprising removing a portion of the common material layer.

18. The method of claim 1, wherein the piezoelectric layer comprises at least polyvinylidene fluoride (PVDF).

19. The method of claim 1, wherein the piezoelectric layer comprises poly(vinylidene fluoride-co-trifluoroethylene) (PVDF-TrFE).

20. A piezoelectric ultrasound sensor, comprising:

a substrate layer;

a plurality of permanent lower electrodes overlaying the substrate layer, wherein the plurality of permanent lower electrodes are electrically isolated from each other and are individually electrically connected to the substrate layer;

a plurality of temporary electrodes at least partially overlaying the substrate layer, wherein each of the temporary electrodes is electrically connected to at least one of the permanent lower electrodes, and wherein each of the temporary electrodes is associated with at least one respective first removed region of temporary electrode material located between adjacent temporary electrodes;

a piezoelectric layer overlaying the permanent lower electrodes and the temporary electrodes, wherein the piezoelectric layer includes a plurality of through holes, and wherein each of the through holes is associated with at least one of the removed regions; and an upper electrode overlaying the piezoelectric layer, wherein the upper electrode includes a plurality of second removed regions associated with the plurality of through holes; and processing circuitry electrically connected to the upper electrode and the plurality of temporary electrodes, wherein, to selectively activate ultrasonic transducers of the piezoelectric ultrasound sensor, processing circuitry is configured to apply a potential to the upper electrode and to selectively apply an activation signal to one or more of the permanent lower electrodes.

21. A system for poling a piezoelectric layer having a plurality of ultrasound transducers, comprising:

a substrate layer comprising a first terminal;

a plurality of permanent lower electrodes overlaying the substrate layer, wherein each permanent lower electrode of the plurality of permanent lower electrodes corresponds to a respective one of the plurality of ultrasonic transducers;

a plurality of temporary electrodes overlaying the substrate layer, wherein the first terminal is electrically connected to the plurality of permanent lower electrodes by the plurality of temporary electrodes, wherein a first material of the plurality of temporary electrodes is a different material than a second material of the plurality of permanent lower electrodes, and wherein the first material is removable by a first etching process and the second material is not removable by the first etching process;

a piezoelectric layer overlaying the plurality of permanent lower electrodes and the plurality of temporary electrodes;

an upper electrode overlaying the piezoelectric layer; and a voltage source coupled to the first terminal and the upper electrode, wherein the voltage source is configured to apply a poling voltage between the first terminal and the upper electrode, and wherein the poling voltage comprises a voltage suitable to modify piezoelectric dipoles of the piezoelectric layer.

* * * * *